United States Patent [19]

Anthony et al.

[11] 4,033,786
[45] July 5, 1977

[54] TEMPERATURE GRADIENT ZONE MELTING UTILIZING SELECTIVE RADIATION COATINGS

[75] Inventors: Thomas R. Anthony; Harvey E. Cline, both of Schenectady, N.Y.

[73] Assignee: General Electric Company, Schenectady, N.Y.

[22] Filed: Aug. 30, 1976

[21] Appl. No.: 718,975

[52] U.S. Cl. .............................. 148/1.5; 148/171; 148/172; 148/177; 148/179; 252/62.3 GA
[51] Int. Cl.² ..................................... H01L 21/225
[58] Field of Search .......... 148/171, 172, 177, 179, 148/1.5; 252/62.3 GA, 62.3 E

[56] References Cited

UNITED STATES PATENTS

| | | | |
|---|---|---|---|
| 2,813,048 | 11/1957 | Pfann | 148/1.5 X |
| 3,627,590 | 12/1971 | Mammel | 148/1.5 X |
| 3,897,277 | 10/1975 | Blumenfeld | 148/171 |
| 3,901,736 | 8/1975 | Anthony | 148/171 |
| 3,904,442 | 9/1975 | Anthony | 148/171 |
| 3,972,742 | 8/1976 | Cline et al. | 148/171 |

*Primary Examiner*—G. Ozaki
*Attorney, Agent, or Firm*—Donald M. Winegar; Joseph T. Cohen; Jerome C. Squillaro

[57] ABSTRACT

Optical coatings are employed on selected surface areas of a semiconductor element to enhance processing of semiconductor materials by temperature gradient zone melting.

17 Claims, 6 Drawing Figures

TEMPERATURE GRADIENT ZONE MELTING UTILIZING SELECTIVE RADIATION COATINGS

BACKGROUND OF THE INVENTION

1. Field of the Invention

This invention relates to the manufacture of semiconductor devices by employment of thermal gradient zone melting and, more specifically, to a method of enhancing the magnitude of the thermal gradient established in the semiconductor material by the temperature gradient zone melting process.

2. Description of the Prior Art

In the manufacture of semiconductor devices, it is normally necessary to alter the conductivity type of a selected region or regions of a semiconductor body by doping these regions with conductivity-modifying impurity atoms. Today, such doping is usually accomplished commercially by solid state diffusion, ion implantation, liquid epitaxial growth, or vapor epitaxial growth. Such factors as cost, speed, junction characteristics and the particular type of semiconductor material being used determine which method is most practical.

A little-used and less widely known technique for doping semiconductor material is temperature gradient zone melting. This technique can produce very abrupt junctions with unusual configurations and high dopant concentrations is a body of semiconductor body in a relatively short period of time. Early descriptions of temperature gradient zone melting and some of its applications are found in U.S. Pat. No. 2,813,048 issued to W. G. Pfann and in his book *Zone Melting* copyright by John Wiley and Sons, Inc. While the basic principle of temperature gradient zone melting was known very early in the life of the semiconductor industry, number of unsolved problems have prevented its use as a standard processing technique by the semiconductor industry.

Temperature gradient zone melting is a process in which a small amount of a dopant metal and/or an intrinsic metal is placed on a selected surface area of a body of semiconductor gradient at an elevated temperature. The overall temperature at which the process is carried out must be sufficiently high that a zone or droplet of alloy melt containing both the semiconductor material and metals will form. Under these conditions, the melt zone will migrate along and up the lines of heat flow from low temperature to high temperature leaving in its path a recrystallized region of semiconductor material containing therein the solid solubility limit of the dopant. The migration speed of the molten zone is directly proportional to the magnitude of the thermal gradient. Thus it is advantageous to have as high a temperature gradient as possible to reduce processing times. The temperature gradient must also be uniform and unidirectional if the pattern of dopant metal imposed on the entrance face of the wafer is to be reproduced as a recrystallized dopant zone faithfully in the semiconductor body. The distorting effects of stray thermal gradients perpendicular to the desired migration direction are minimized by a relatively large thermal gradient along the migration direction since the resulting faster processing speed implies that there is less time for the stray perpendicular thermal gradients to cause irregularities to develop.

One of the most difficult problems blocking the widespread use of temperature gradient zone melting has been how to generate a large uniform thermal gradient in a thin fragile semiconductor wafer without mechanically stressing the wafer or contaminating the wafer with undesirable impurities.

A number of means of applying a large uniform thermal gradient have been tried including a plasma torch, a gas flame, a scanning electron beam, a heated anvil and infrared radiation. Each of these methods has its own problems and none of these methods produces both a uniform and a large thermal gradient. For example, while the plasma torch, gas flame, scanning electron beam and heated anvil can produce large thermal gradients, these same thermal gradients have not been uniform and have caused irregularities in the doped zones produced by temperature gradient zone melting utilizing these techniques.

The most practicable means of imposing a uniform thermal gradient on a semiconductor wafer is by exposing one of its major surfaces to a widely dispersed, uniform, intense source of radiation such as infrared or optical radiation that is absorbed at the exposed surface of the wafer. The absorbed heat then flows uniformly through the wafer where it is reradiated to a cold black heat sink facing the other major surface of the wafer.

The most satisfactory method of applying a uniform temperature gradient to a thin semiconductor wafer is by exposing one side of a semiconductor wafer to an intense uniform source of infrared radiation and the opposing side of the wafer to a cold black body. For a complete description of the infrared radiation method, attention is directed to the copending application of John K. Boah entitled "Temperature Gradient Zone Melting Utilizing Infrared Radiation", application Ser. No. 578,807, filed May 19, 1975, assigned to the same assignee as this application.

Although the infrared radiation method has produced the most uniform thermal gradients of all the above listed methods, it also produces the smallest thermal gradient of the above methods. This small thermal gradient is the result of several factors. First, the intensity of available infrared radiation sources is limited. Secondly, the large reflectivity of semiconductor wafers caused by the unusually high refractive index of semiconductor materials limits the amount of radiation the semiconductor wafer can either absorb or re-radiate. Since the magnitude of the thermal gradient in the wafer is directly proportional to the amount of heat absorbed by the wafer, the limited absorbtivity of a semiconductor wafer as well as the limited radiation sources available imply in turn a relatively small thermal gradient in the semiconductor wafer. This small thermal gradient, in turn, causes temperature gradient zone melting speeds to be low, increases the chance of doped zone irregularities produced by competing lateral thermal gradients and makes impossible the dopant of zones by temperature gradient zone melting below a critical dimension that is inversely proportional to this applied thermal gradient.

In summary, although the infrared radiation method of temperature gradient zone melting makes temperature gradient zone melting practicable on the commercial scale by providing a means of producing a uniform thermal gradient, it has several drawbacks since it produces a relatively small thermal gradient in a semiconductor body.

DESCRIPTION OF THE INVENTION

Figure 1:
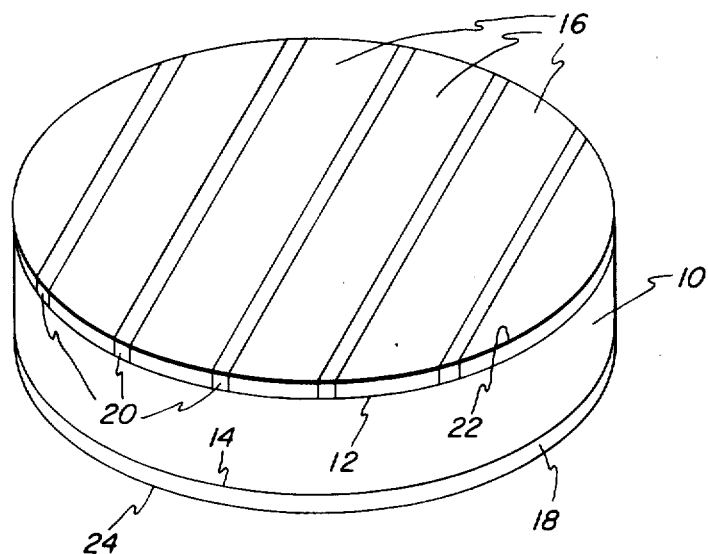
FIG. 1 is an isometric view of a body of semiconductor material embodying a uniform selective radiation absorbing coating material on selected surface portions of the opposed major surfaces of the body.
Figure 2:
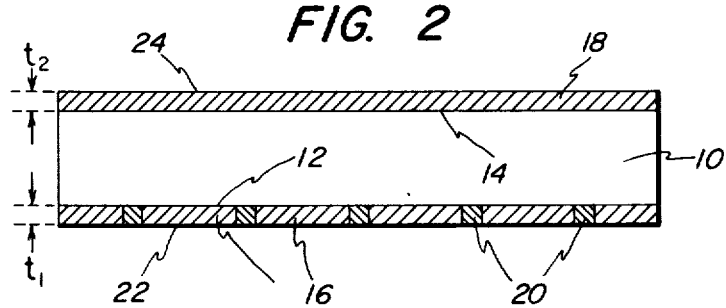
FIG. 2 is another isometric view of the body of semiconductor material of FIG. 1 wherein the body has been inverted.
Figure 3:
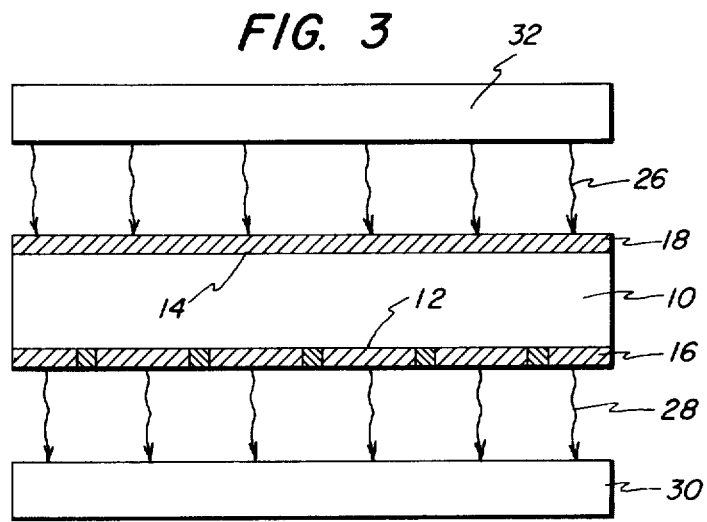
FIG. 3 is a side elevation view, partly in cross-section, of the illustrating the flow of heat from the source, through the body, and to the heat sink.

Referring now to FIGS. 2 and 3, there is shown a wafer, or body 10, of semiconductor material having opposed major surface 12 and 14 which are, respectively, the top and bottom surfaces thereof. The semiconductor material may be silicon, germanium, silicon carbide, gallium arsenide, a compound of a Group II element and a Group VI element and a compound of a Group III element and a Group V element. In order to describe the invention in more detail, and for no other reason, the material of the body 10 is said to be silicon of N-type conductivity.

Usually, the wafer 10 will have a uniform distribution of atoms of a dopant material that induces a given conductivity type and a predetermined level of resistivity in the silicon. Generally, the given conductivity type will be the opposite conductivity type of the dopant that is to be thermally migrated through the wafer 10.

We have discovered that the practice of temperature gradient zone melting can be substantially improved if the first step in the subject thermal migration process is to deposit or grow on the surfaces 14 and 12 uniform coating layers 18 and 16, respectively, that will be transparent to the incident radiation emitted from the radiation course used for heating the wafer, or body 10, and radiation re-radiated from the wafer, or body 10, during the practice of temperature gradient zone melting.

The material of the coating layers 16 and 18 should be compatible with the semiconductor material being processed. Further, it should be capable of being selectively etched for tailoring its thickness to desired limits for optical performance. Additionally, the material should be one which is capable of being selectively chemically etched to enable one to form desired window patterns in the layer 16. Thereafter, the deposition of one or more preferred metals in the windows on areas of the surface 12 disposed therein is practiced to migrate the preferred metal or metals through the material of the body 10.

The layer 16 of a material functions as an antireflection coating and is suitable for absorbing a predetermined range of wavelengths of the radiation spectrum is disposed on a selected portion of the surface 12. The layer 16 has a thickness equal to a multiple of one-fourth of the wavelength $\lambda_b$ within the layer 16 of material of the most intense portion of the radiation spectrum re-radiated from the heated semiconductor wafer 10 during the practice of the process of thermal migration. The general formula for the thickness of the layer 16 is as follows:

$$t_1 = \frac{(2n-1)b}{4} \tag{1}$$

wherein $t_1$ is the thickness of the layer 16;

$n$ is any positive integer greater than zero, and $b$ is a wavelength of the radiation spectrum emitted by the body 10 through surfaces 14 and defined by the following equation:

$$b = \frac{\lambda_B}{N_c} \tag{2}$$

wherein $\lambda_B$ is the wavelength of the same radiation in vacuum, and $N_c$ is the index of refraction of the material comprising the layer 16.

The layer 18 of material also functions as an antireflection coating and is suitable for absorbing a predetermined range of wavelength of the radiation spectrum is disposed on a selected portion of the surface 14. The layer 18 has a thickness $t_2$ equal to a multiple of one-fourth of the wavelength of the incident radiation from a radiant energy source 32 within the layer 18 of material. The thickness $t_2$ is defined as follows:

$$t_2 = (2n-1)\frac{\lambda_s}{4} \tag{4}$$

wherein $t_2$ is the thickness of the layer 18;

$n$ is any positive integer greater than zero, and $\lambda_s$ is a wavelength of the radiation spectrum emitted by the radiant energy source 18 within the layer 18 of the material layer and defined by the following equation:

$$\lambda_s = \frac{\lambda_S}{N_c} \tag{5}$$

wherein $\lambda_S$ is the wavelength of the same radiation in vacuum, and $N_c$ is the index of refraction of the material comprising the layer 18.

and by substitution in equation 4, $t_2$ may be expressed as follows:

$$t_2 = \frac{(2n-1)\lambda_S}{4N_c} \tag{6}$$

As stated previously, the coating layers 16 and 18 act as anti-reflection coatings on the surface of the semiconductor body 10. The layers 16 and 18 have respective major surfaces 22 and 24. The antireflection coating layer 18 increases the amount of radiation 26 absorbed by surface 14 of the semiconductor body 10 from the radiation source 32. The antireflection coating 16 increases the amount of heat 28 re-radiated from the surface 12 of the semiconductor body 10 to a black body heat sink 30. Therefore, the amount of heat passing through the semiconductor body 10 is increased and enhances the thermal gradient zone melting process.

In order that the antireflection coatings act with their maximum efficiency, the material comprising the coating layers 16 and 18 should be completely transparent and have an index of refraction $n_c$ which is expressed by the following equation:

$$n_c = \sqrt{n_s n_0} \qquad (7)$$

wherein $n_s$ = index of refraction of the material of the body 10
$n_0$ = index of refraction of the recurring medium in which migration is practiced For purposes of illustration, the body 10 can be considered to be a wafer of silicon. The index of refraction of silicon at a wavelength of about one microns is 3.7. Thus the antireflection coatings 16 and 18 preferably should have an index of refraction of 1.93 and should have a 100% transmission of the radiation. The material of the antireflection coatings 16 and 18 must also not cause contamination or doping of the material of the body and must not melt, decompose, or evaporate or otherwise be unstable at the temperature, typically 1150° C, and for the period of time, typically 5 minutes, of the temperature gradient zone melting process.

Since most radiation sources of energy are not monochromatic sources of radiation, we have found that the wavelength that one must use to determine the thickness $t_2$ of the material of the layer 18 which functions to concentrate radiation from the source 32 to heat the body 10 is the wavelength of the most intense portion of the incident radiation spectrum. For example, utilizing GE 3200T 3/1CL Quartz Infrared Lamps available from the General Electric Company as radiation sources with a filament temperature of 2893° Kelvin, one finds that the most intense portion of the radiation spectrum is centered about a wavelength of one micron in vacuum. The passage of the radiation through the body 10 causes the wavelength of the radiation to increase in accordance with the temperature at which migration is practiced. The body 10 is at this temperature of migration. The wavelength in vacuum of the most intense radiation re-radiated from the semiconductor body 10 through the surface 12 during the practice of thermal migration is given in Table I for various processing temperatures of body 10 when the material thereof is silicon.

Table I

| Temperature in ° C of Wafer | Wavelength in microns of Reradiated Radiation from Wafer |
|---|---|
| 1400 | 1.73 |
| 1350 | 1.78 |
| 1300 | 1.84 |
| 1250 | 1.89 |
| 1200 | 1.96 |
| 1150 | 2.02 |
| 1100 | 2.11 |
| 1050 | 2.18 |
| 1000 | 2.27 |
| 950 | 2.36 |
| 900 | 2.45 |
| 850 | 2.55 |
| 800 | 2.68 |

We have found that silicon oxide grown on the surfaces 12 and 14 of the silicon body 10, in an oxidizing atmosphere, to the thickness required by the one-quarter wavelength criteria of each of the layers 16 and 18, closely meets all of these ideal requirements.

Suitable materials for comprising the layers 16 and 18 are silicon oxide, silicon nitride, aluminum oxide, aluminum nitride and the like. However, silicon oxide is preferred when the body, or wafer, 10 is of silicon and it facilitates the ease of fabrication of silicon devices.

Silicon oxide forms a stable material coating with an index of refraction of 1.5 and a transmission coefficient of 85%. A silicon oxide layer 18 with a thickness of one-quarter wavelength increases the radiation absorbed by the surface 14 of the semiconductor body 10 by about 42 percent. Similarly, a silicon oxide layer 16 with a thickness of onequarter wavelength increases the heat re-radiated from surface 12 to the heat sink 30 by about 42 percent. The resulting thermal gradient in the silicon wafer 10 is increased also by 42 percent over the prior art processing technique for TGZM. This increased thermal gradient decreases processing times, processing costs and the energy used in the process of temperature gradient zone melting (TGZM) by equivalent amounts relative to the practice of temperature gradient zone melting without selective radiation coatings 16 and 18.

Since the thickness of each of the layers 116 and 126 is determined by the wavelength of the radiation within each layer, $t_1$ does not equal $t_2$. Further, $t_1$ is actually greater than $t_2$.

Table II gives the thickness of the layers 116 and 126 of silixon oxide required on the silicon wafer 110 to minimize thermal gradient edge distortion effects for a radiation source of GE 3200T 3/1CL High Temperature Quartz Lamps operating at a tungsten filament temperature of 2893° C for various TGZM semiconductor wafer processing temperatures.

Table II

| Wafer Temperature-° C | Thickness of layer 16-microns | Thickness of layer 18-microns |
|---|---|---|
| 1400 | 0.280 | 0.167 |
| 1300 | 0.290 | 0.167 |
| 1200 | 0.305 | 0.167 |
| 1100 | 0.328 | 0.167 |
| 1000 | 0.352 | 0.167 |
| 900 | 0.380 | 0.167 |
| 800 | 0.408 | 0.167 |
|  | 0.448 | 0.167 |

In order to grow silicon oxide from the material of the body 10 or vapor deposit silicon oxide of the different thicknesses listed in Table III, on the respective surfaces 16 and 18, two sequential forming of or deposition process steps may be practiced. Suitable processes which may be practiced for growing or depositing the layers 16 and 18 of silicon oxide on the respective surfaces 12 and 14 of the semiconductor body, or wafer 10, include, but is not limited to, steam oxidation, oxidation in dry oxygen, anodic oxidation, gasous anodization, pyrolysis, evaporation, reactive sputtering, carbon dioxide oxidation, and oxide formation by chemical transport technique.

In order to illustrate the process steps required to form the layers 16 and 18 of the desired thickness given in Table II, the processing of a work piece or wafer 10 at an elevated temperature of 1200° C by means of oxidation in dry oxygen will be described.

A polished silicon wafer was exposed to dry oxygen at 1000° C ± 5° C for about 560 minutes to form a silicon oxide layer of approximately 0.29o microns thickness on both sides of the wafer. The processed silicon wafer was removed from the oxidation furnace and the layer of oxide corresponding to layer 18 on surface 14 of the wafer 10 was removed by selective chemical etching in a buffered hydrofluoric acid solution. The silicon wafer was disposed in the oxidation furnace again and oxidation of the wafer surfaces was again practiced as before for about an additional 240 minutes at 1000° C ± 5° C to grow a silicon oxide layer 18 of about 0.167 microns thickness on the surface 14 of the wafer 16 and to increase the thickness of the oxide layer on the surface 12 from about 0.290 microns to about 0.328 microns. The wafer 10 was then removed from the oxidation furnace.

Other oxidation temperatures to form the required silicon oxide coatings may also be used. Table III, which follows, tabulates the approximate furnace time required to form the respective layers 16 and 18 at various selected temperatures.

Table III

| Oxidation Temperature ° C | First Oxidation Time-minutes | Second Oxidation Time-minutes |
| --- | --- | --- |
| 800 | 6300 | 4000 |
| 900 | 1700 | 800 |
| 1000 | 560 | 240 |
| 1100 | 210 | 90 |
| 1200 | 64 | 40 |
| 1300 | 56 | 24 |
| 1400 | 40 | 15 |

Following formation of the selective radiation coatings 16 and 18 on the surfaces 12 and 14 of the semiconductor wafer 10, a window and/or windows of a predetermined geometric configuration is etched through the coating material layer 16 by conventional photolithography techniques. For example, for a silicon oxide coating layer 16 on a silicon wafer 10, a buffered hydrofluoric acid solution is used to etch the window pattern. Thereafter, the material 20 is deposited in the windows, and the processed wafer 10 prepared for migration of the material 20 as a melt of molten material through the solid material of the body, or wafer 10.

Preferably, the wafer 10 is oriented so that the surfaces 12 and 14 are in the (111) crystallographic plane. Under these conditions, the aluminum metal 20 will preferably migrate as part of the melt along the <111> axis of the material of the body 10. Other exemplary stability conditions for migration of a melt of metal-rich semiconductor material through the wafer 10 are as shown in Table IV.

Table IV

| Wafer Plane | Migration Direction | Stable Wire Directions | Stable Wire Sizes |
| --- | --- | --- | --- |
| (100) | <100> | <011>* | <100 microns |
|  |  | <0$\bar{1}$1>* | <100 microns |
| (110) | <110> | <110>* | <150 microns |
| (111) | <111> | *a) <01$\bar{1}$> |  |
|  |  | <10$\bar{1}$> | <500 microns |
|  |  | <1$\bar{1}$0> |  |
|  |  | b) <11$\bar{2}$>* |  |
|  |  | <$\bar{2}$11>* | <500 microns |
|  |  | <1$\bar{2}$1>* |  |
|  |  | c) Any other direction in | <500 microns |

Table IV-continued

| Wafer Plane | Migration Direction | Stable Wire Directions | Stable Wire Sizes |
| --- | --- | --- | --- |
|  |  | the (111) plane* |  |

*The stability of the migrating wire is sensitive to the alignment of the thermal gradient with the <100>, <110> and <111> axis, respectively.
+Group a is more stable than group b which is more stable than group c.

Other geometrical configurations include square, rectangular, triangular, circular, disc, and the like, shapes. They may be disposed in either a random array, an orderly array or a combination of both. In all instances, however, planar orientation of at least one of the major surface 12, and as well as that of surface 14, axis of migration and stable wire, or corresponding crystal axis, directions must be adhered to in order to ensure stable migration of the melt through the body or wafer 10.

Figure 4A:
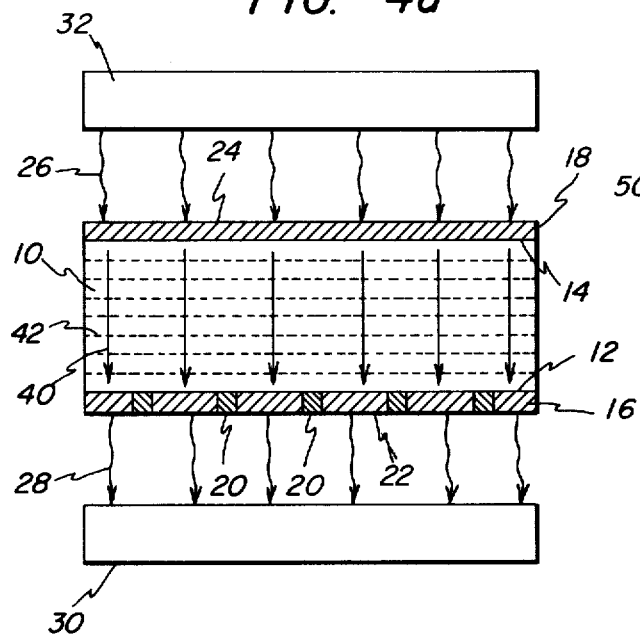
FIG. 4a is a side elevation view, partly in cross-section, illustrating heat flow lines in a body of semiconductor material processed in accordance with the teachings of this invention.

With reference now to FIG. 4a, the increased absorption of radiation 26 and re-radiation 28 results in a strong heat flow 40 through the body, or wafer 10, and closely spaced isotherms 42. The enhanced heat flow, in turn, increases the thermal gradient in the semiconductor body 10 and results in a faster processing time of the material and therefore results also in the conservation of energy. Additionally, a more dimensionally accurate doped zone, or region, configuration is obtained along with the ability to migrate smaller melt zones, or droplets, during the practice of temperature gradient zone melting.

Figure 4B:
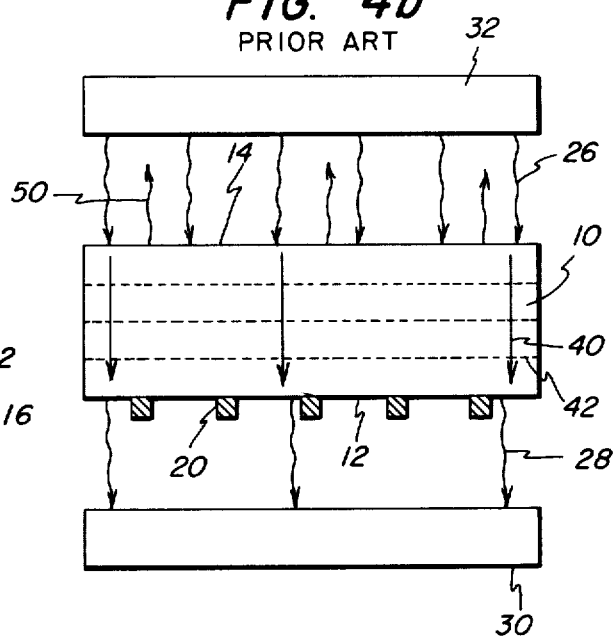
FIG. 4b is a side elevation view, partly in cross-section, illustrating heat flow lines in a body of semiconductor material processed in accordance with prior art methods.

Referring now to FIG. 4b, a semiconductor wafer 110 without selective radiation coatings is disposed between the radiation heat source 32 and the black body heat sink 30. All items denoted by the same reference numerals as employed heretofore in describing FIGS. 1, 2, 3 and 4a, are the same, and function in the same manner, as previously described.

In the standard practice of temperature gradient zone melting is practiced without the selective radiation coatings on selected surface areas 12 and 14 of the semiconductor wafer 110. The lack of the selective radiation coating material on surface 14 results in a reflection 50 of some of the incident radiation 26 from the surface 14. Similarly, the re-radiation of heat 28 from surface 14 is also diminished by the lack of a radiation coating causing a decrease of heat flow 40 through the body 110 and widely spaced isotherms 42. In other words, a smaller thermal gradient is produced across the body 110, then when the coating material layers 16 and 18 are employed on the body 10.

The aluminum material 20 of the linear or wire-like regions is preferentially alloyed to the surface 12. The alloying step helps assure uniform wetting between the silicon and the aluminum to achieve best results. This may be accomplished as a separate heating step or as part of a continuous sequential thermal process operation.

Figure 5:
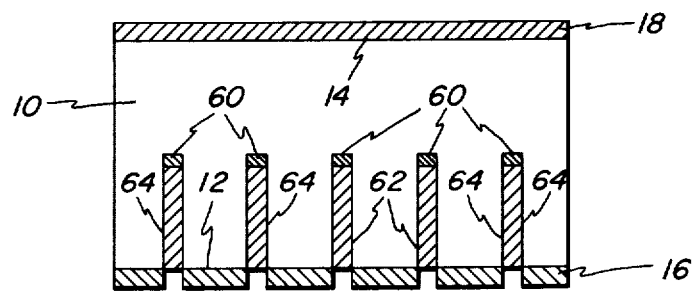
FIG. 5 is a side elevation view, partly in cross-section, of a body of semiconductor material being processed in accordance with the teachings of this invention.

Referring again to FIG. 3, as well as to new FIG. 5, the wafer 10 is placed in thermal migration apparatus with the surface 14 facing the radiation heat source 32 and the temperature gradient zone melting process begins when the radiation heat source 32 is energized. First, an aluminum-rich melt of silicon is formed on surface 12 within the confines or windows of the patterned areas of the coating layer 16. The melt will begin to dissolve the silicon on the hottest side thereof, surface region 12. Concurrently, doped silicon will begin to recrystallize on the coolest side thereof, or on the rear side of the melt as it moves, or migrates toward surface 14. Thus referring to FIG. 5, the melt 60 will migrate into the material of the wafer 10 in an upward direction toward surface 14. Behind the melt 60, a recrystallized region 62 of sillicon doped with aluminum to the solid solubility limit in silicon at that temperatutre of migration, will be deposited and formed within the body 10.

If the process is continued for a sufficient period of time, typically 2 to 15 minutes depending on the wafer thickness, temperature of processing, the magnitude of the temperature gradient, etc., the melt 60 will emerge on the hot side 14 of the wafer 10. The recrystallized region 62 will extend through the entire wafer 10 and form two parallel planar P-N junctions 64 in the wafer 10 for each of the parallel linear melts 60 that originated on surface 12 of the wafer 21 and migrated through the body 10.

Other advantages of a selective radiation coating include the ability to decrease the temperature of the infrared radiation source while maintaining a given temperature gradient in the semiconductor body. The lower radiation source temperature in the case of the normally-used high-temperature quartz lamps produces a rapid nonlinear increase in lamp life, thus leading to a lower cost process and also to a conservation of electrical energy. Furthermore, selective radiation coatings, especially if they are native semiconductor oxide grown to a suitable thickness on the semiconductor body, prevent undesirable impurities from diffusing into or reacting with the semiconductor body during the temperature gradient zone melting process.

The layer of material which forms the radiation coating may be formed on one major surface only. The other surface has only the natural occurring oxide layer thereon. For example, in the TGZM process technique wherein the metal to be migrated is deposited directly onto the major surface 12 without the use of windows in an oxide film, the layer of material having the desired optical properties is grown only on surface 14. Alternately, the material may be grown on surface 12 only as layer 16 and surface 14 has only a natural occurring oxide film.

In either instance, an improvement in the heat flow through the body 10, over that of the prior art, is achieved but it is not as great as when the layers 16 and 18 are grown on the body 10. As stated previously, the lack of the selective radiation coating on surface 14 causes a reflection of some of the incident radiation impinging upon the surface. The lack of the selective radiation coating on surface 12 decreases the efficiency of re-radiation from the surface 12 to the heat sink 30 and results in a decrease in heat flow through the body 10.

We claim as our invention:

1. An improvement in the processing of a body of semiconductor material by thermal gradient zone melting comprising the steps of:
    a. selecting a body of semiconductor material having a preferred crystal structure, a preferred type of conductivity, a preferred level of resistivity, two major opposed surfaces being, respectively, the top and bottom surfaces of the body, at least one of the major surfaces having a preferred planar crystal orientation, and a vertical axis substantially aligned with a first preferred crystal axis of the material of the body;
    b. forming a layer of a material suitable for absorbing a predetermined range of wavelength of the radiation spectrum impinging thereupon on at least one of the two major opposed surfaces, the layer having a predetermined thickness, $t$, expressed by the following general equation:

$$t = \frac{(2n-1)\lambda}{4N}$$

wherein
    $n$ = any positive integer greater than zero
    $\lambda$ = the wavelength of the most intense portion of radiation spectrum impinging upon the material in vacuum and
    $N$ = the index of refraction of the material;
    c. exposing the processed body to a source of radiant energy;
    d. absorbing the predetermined range of wavelength of the most intense portion of the spectrum in the layer of material, and
    e. increasing the heat flow lines through the material of the body to enhance the migration of a melt of metal-rich semiconductor through the body by thermal gradient zone melting.

2. The process of claim 1 wherein
the material of the body is silicon, and the material of the layer is silicon oxide.

3. The process of claim 2 wherein
$\lambda$ is about one micron.

4. The process of claim 3 wherein
the silicon oxide is formed by thermal oxidation of the material of the body.

5. The process of claim 1 and including
disposing the body between a source of radiant energy and a heat sink and oriented to expose one major surface to the radiant energy source and the other major surface to the heat sink.

6. The process of claim 5 wherein
the layer is formed on the major surface exposed to the heat sink, and
$\lambda$ is determined by the radiation spectrum emitted by the body at the surface upon which the layer is formed.

7. The process of claim 6 wherein
the material of the body is silicon, and the material of the layer is silicon oxide.

8. The process of claim 7 wherein
the silicon oxide is formed by thermal oxidation of the material of the body.

9. The process of claim 5 wherein
the layer is disposed on the major surface exposed to the source of radiant energy, and
$\lambda$ is determined by the radiation spectrum emitted by the source.

10. The process of claim 9 wherein
$\lambda$ is about one micron.

11. The process of claim 10 wherein
the material of the body is silicon, and the material of the layer is silicon oxide.

12. The process of claim 11 wherein
the silicon oxide is formed by thermal oxidation of the material of the body.

13. The process of claim 5 wherein
a layer is formed on each of the opposed major surfaces.

14. The process of claim 13 wherein

λ of the source is about 1 micron and is employed to determine the thickness of the layer which is exposed thereto, and λ of the radiation of the body is employed to determine the thickness of the layer exposed thereto and to the heat sink.

15. The process of claim 14 wherein
the material of the body is silicon, and
the material of the layer is silicon oxide.

16. The process of claim 15 wherein
the silicon oxide is formed by thermal oxidation of the material of the body.

17. The process of claim 13 wherein
one of the layers and a portion of the other layer are formed simultaneously.

* * * * *